United States Patent [19]

Heberle

[11] Patent Number: 5,399,965
[45] Date of Patent: Mar. 21, 1995

[54] FLOATING DATA INTERFACE

[75] Inventor: Klaus Heberle, Reute, Germany

[73] Assignee: Deutsche ITT Industries GmbH, Freiburg, Germany

[21] Appl. No.: 989,318

[22] Filed: Dec. 11, 1992

[30] Foreign Application Priority Data

Feb. 21, 1992 [DE] Germany .................. 42 05 241.6

[51] Int. Cl.6 ............................................. G01R 1/04
[52] U.S. Cl. .............................. 324/117 H; 324/126
[58] Field of Search ................. 379/443; 324/117 H

[56] References Cited

U.S. PATENT DOCUMENTS 4,764,922  8/1988  Deiter et al. .................... 379/443
5,239,580  8/1993  Bruno et al. .................... 379/443

FOREIGN PATENT DOCUMENTS 0044685  7/1981  European Pat. Off. .
55-8153  1/1980  Japan .

OTHER PUBLICATIONS

Patent Abstract of Japan, vol. 011, No. 363 (E-560), 26, Nov., 1987 & JP-A-62 136 145 (Fuji Facom Corp.) 19, Jun., 1987.
Powerconversion & Intelligent Motion, Bd. 15, Nr. 5, May 1989, Vnetura, Calif. US Seiten 70–74, R. Vig Smart Sensor Provides Magnetic Detection with Simplified System Wiring.
Klaus Fischer, "Drehzahlerfassung mit Differenz-Hall-IC," Elektronik, Apr. 1991, pp. 86, 95–97.

Primary Examiner—Kenneth A. Wieder
Assistant Examiner—B. C. Bowser
Attorney, Agent, or Firm—Thomas L. Peterson

[57] ABSTRACT

A floating data interface, particularly for integrated circuits, is formed by a Hall-effect arrangement that includes a Hall-voltage-measuring device and a current-carrying coupling loop whose current is controlled by a data source. Because of the low internal resistance of the coupling loop, a plurality of such interfaces can be connected in series, and the individual circuits selected by addresses. Bidirectional data transfer via the floating interface is accomplished by an interrupter stage which interrupts the current flow on the bus line in an interrogation interval during one clock period and forces a predetermined mark/space ratio.

10 Claims, 2 Drawing Sheets

FLOATING DATA INTERFACE

BACKGROUND OF THE INVENTION

1. Field of the Invention

The present invention relates to a floating data interface, particularly for monolithic integrated circuits.

2. Description of the Related Art

There are many applications in which data has to be read on a floating basis. For example, if data lines are long and faulty, the potential variations between data source and data sink may be too large, so that the data will not be correctly recognized or the associated circuits will be destroyed by voltage spikes. A certain remedy is provided by transmitting the data as difference signals over a two-wire line and evaluating them by means of a differential input stage, which, as is well known, can suppress DC level variations provided that the variations lie within the permissible dynamic range. Another known remedial measure is the use of optocouplers, which are inserted as a floating data interface between the respective circuit and the data bus. This, however, is expensive and requires additional circuitry.

It is, therefore, the object of the invention to provide a floating data interface which is especially suitable for monolithic integrated circuits and can be implemented together with the latter on a single chip.

SUMMARY OF THE INVENTION

The fundamental idea of the invention is to use a Hall-voltage-measuring device for the floating data interface. The Hall-voltage-measuring device evaluates the magnetic field of a current-carrying coupling loop. The variation of the current with time represents the transmitted data information. According to the (as yet unpublished) European patent applications entitled "Self-Compensating Hall Sensor", Ser. No. 91 11 2840.3, and "Offset-Compensated Hall Sensor", Ser. No. 91 12 2046.5, such Hall-voltage-measuring devices can advantageously be integrated on a single semiconductor chip using conventional semiconductor integrated circuit fabrication techniques, the material-dependent and temperature-dependent tolerances of the Hall cells proper being largely compensable by suitable circuits. The arrangement and size of the coupling loop is uncritical. The coupling loop can be integral to the semiconductor chip, with voltage isolation being provided, for example, by a third oxide layer on the semiconductor layer. The coupling loop may also be located outside the integrated circuit, in which case it does not even need any connecting contacts on the chip surface. The greater distance between the Hall cell and the coupling loop requires a greater magnetic field, of course.

A principal advantage of the Hall-effect data interface is that the coupling loop has a low impedance, so that the voltage drop remains small. It is therefore possible to connect a plurality of such interfaces in series. Because of the low impedance, the sensitivity of the data line to capacitive interference signals is low. Magnetic interference can be kept low by a twisted two-wire line. These beneficial properties are particularly advantageous if the interface is used in the automotive field, because there the data sources and sinks are spaced far apart and are affected by a multitude of interference sources.

BRIEF DESCRIPTION OF THE DRAWINGS

The invention and further advantages thereof will now be explained in greater detail with reference to the accompanying drawings in which.

DETAILED DESCRIPTION OF THE INVENTION

Figure 1:
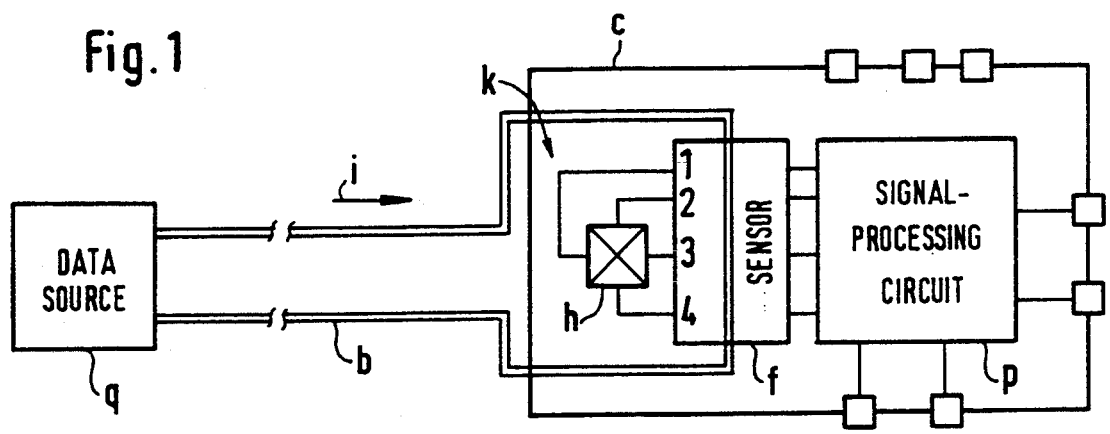
FIG. 1 shows schematically a unidirectional Hall-effect data interface.

In FIG. 1, a data source q is connected via a bus line b to an integrated circuit c. The bus line carries a current i which, in the simplest case, contains as information a binary signal-or a data word. The data source q may be a central processor, for example, which controls a signal-processing circuit p via the bus line b by sending to the former a single control signal, serial data, or instructions. The signal-processing circuit p is connected within the integrated circuit c to a Hall-voltage-measuring device comprising a sensor f and at least one Hall cell h. The sensor f delivers the current for the Hall element h between the terminals 2 and 4, for example, and takes the respective Hall voltage across the terminals 1 and 3. The terminals 1 through 4 may also be interchanged during interrogation by internal switching devices as described in the aforementioned European Patent Application entitled "Offset-Compensated Hall Sensor", whereby the direction-dependent properties of the Hall cell h or the cooperating Hall cells can be nearly completely compensated. The coupling loop k is indicated in FIG. 1 by only one turn which is located outside the integrated circuit k. Several turns may be used to increase the sensitivity.

Figure 2:
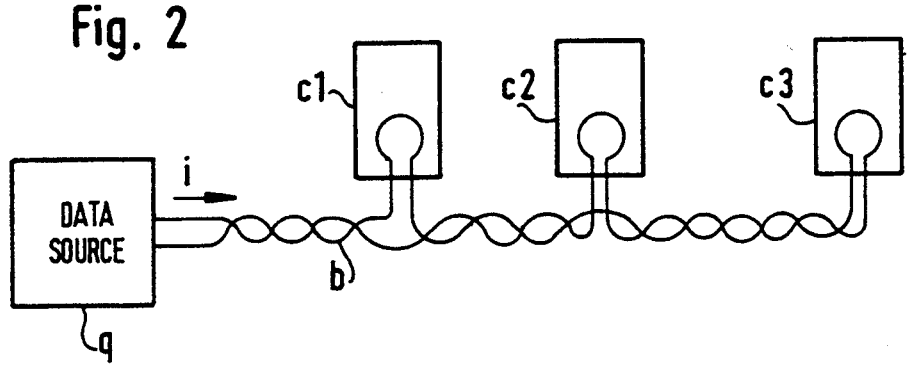
FIG. 2 shows schematically a data source and three receiver circuits which are connected in series via a two-wire bus.

In FIG. 2, the bus line b is shown as a twisted two-wire line which is supplied with the data-dependent current i from the data source q. First, second, and third circuits $c1$, $c2$, and $c3$, respectively, are serially connected to the bus line b via one coupling loop each.

Figure 3:
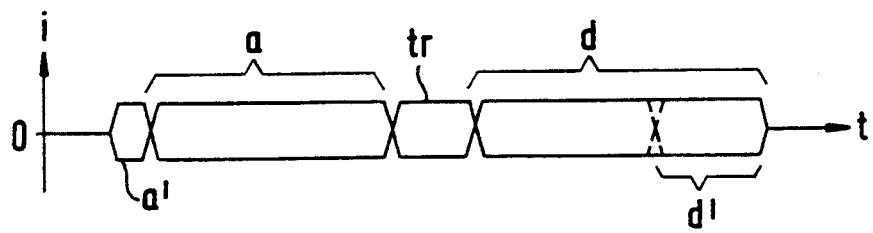
FIG. 3 shows schematically as an example the format of the transmitted data.
Figure 4:
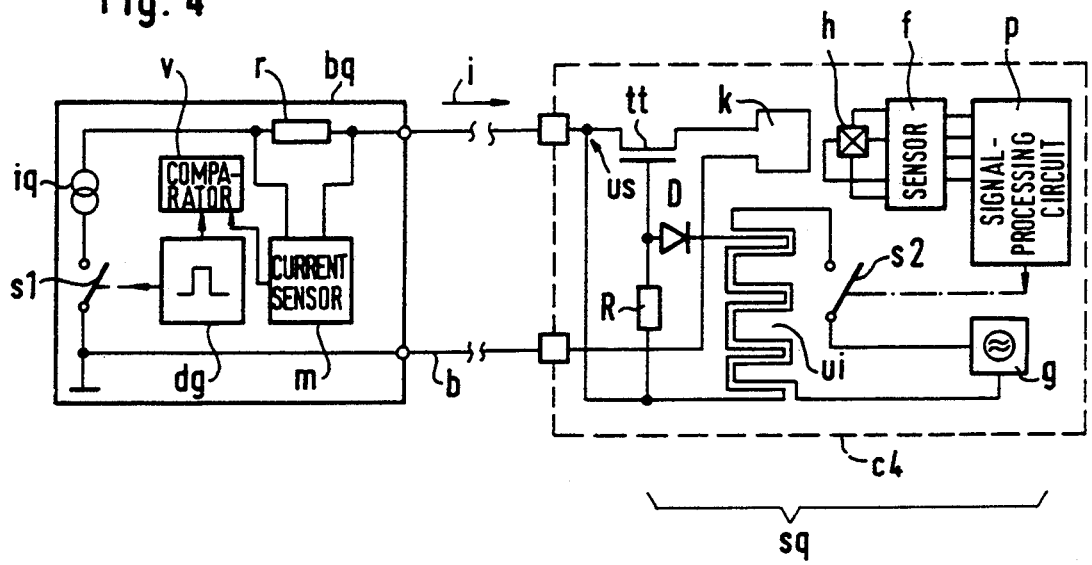
FIG. 4 shows schematically one embodiment of a bidirectional interface.
Figure 5:
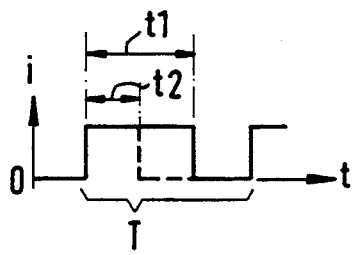
FIG. 5 shows schematically one data clock period in the interrogation interval.
Figure 6:
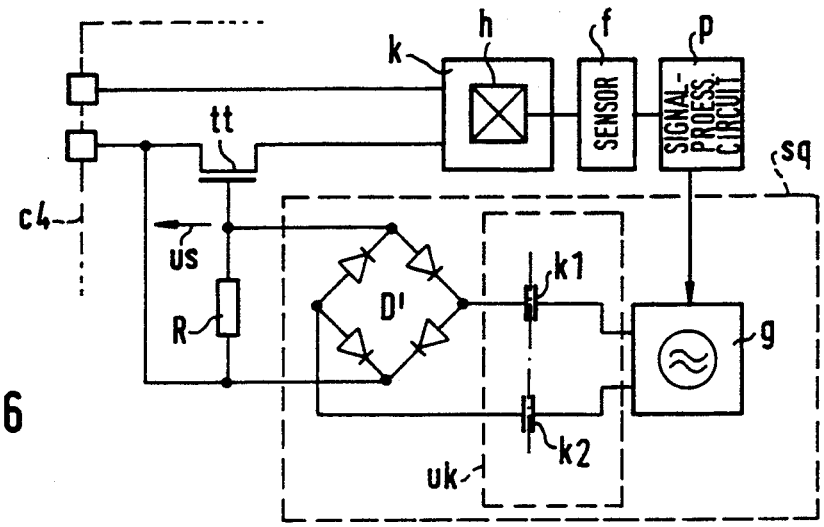
FIG. 6 shows schematically another embodiment of a bidirectional data interface.

FIG. 3 shows an exemplary data format which is transmitted on the bus line b by the data-dependent current i. The respective logic state is transmitted by a first or second current value, either of which may be zero. The first current value may also be positive and the second negative. In that case, the circuit is somewhat more complex but offers advantages as a result of the double swing and the more uniform current load. The data format may begin with a start or sync character $a'$. This character is followed by an address part a, a data delimiter tr, and a data part d, which may include an interrogation interval $d'$, in which the addressed circuit $c4$ can send data to the data source bq, as shown in FIG. 4 or FIG. 5. The data source bq thus acts as a master stage by reading data from the individual slave stages as required. This is only possible, however, if the floating data interface is effective in both directions. Two such embodiments are shown in FIGS. 4 and 6.

If the resolution of the Hall-voltage-measuring device h, f can reliably distinguish between more than two current levels, multi-valued data signals can be transmitted.

The bidirectional data interface of FIG. 4 contains the subcircuits of FIG. 1, which are designated by like reference characters, as well as further subcircuits. As in FIG. 1, a data source bq is connected by a two-wire bus line b to a circuit c4, which, however, can send data to the data source bq upon request. This is done by means of an interrupter stage tt, which opens the bus line b or the coupling loop k in the circuit c4 being interrogated. By means of a current sensor m and a sensing resistor r in the data source bq, the latter senses that no current c is flowing even though a clocked data generator dg has connected a current source iq to the bus line b by means of a first switch s1. A comparator v recognizes that the interrupter stage tt was activated by the interrogated circuit c4 by the disagreement between the desired state and the actual state on the bus line b.

The interrupter stage tt is, for example, an enhancement-type MOS transistor, henceforth also called "interrupter transistor tt", having its drain-source path connected in series with the coupling loop k. A control voltage us is applied between the gate and source electrodes. The control voltage us is derived in a control-voltage source sq by rectifying a high-frequency signal. To this end, the semiconductor chip includes a monolithic integrated high-frequency transmission stage ui whose primary side is fed from a high-frequency generator g and whose secondary side delivers the control voltage us following the rectification. The high-frequency transmission stage ui can be very small, because the frequency to be transmitted is high and the control voltage us only needs to recharge the gate capacitance of the interrupter transistor tt. The gate capacitance is discharged through a high-value resistor R or through any other passive or active circuit means. The data-based turning on and off of the high-frequency transmission stage ui is effected by a control output of the signal-processing stage p, which either acts directly on the high-frequency generator g or closes or opens the primary side by means of a second switch s2.

The use of an enhancement-type MOS transistor has an added advantage in that the coupling loop concerned remains closed even when the associated circuit c4 is dead. This permits a standby mode, in which only few circuits are activated, for example. The bus line b must not be interrupted in this mode. One application is, for example, an activated antitheft alarm system for automobiles in which the central processor must only interrogate particular sensor circuits while other circuits are disconnected for battery conservation.

The design of the high-frequency transmission stage ui is uncritical and, hence, quite arbitrary. In the embodiment of FIG. 4, a meander form has been chosen for the inductive high-frequency transmission system state ui. The primary and secondary sides may lie in one plane or in different planes. The MOS transistor tt, the diode D, and the resistor R are also integrated circuit elements. Floating with respect to the remainder of the circuit must also be ensured with regard to the necessary breakdown strength by making the distances to the remainder of the circuit great enough. Thus, there is no electric connection at any point and in any operating condition.

FIG. 5 shows one clock period T of the data format within the interrogation interval d'. The data generator dg closes the first switch s1 during the period t1. If the interrogated circuit c4 is to signal a "0" to the data source bq in the clock period T, the current characteristic of FIG. 5 will not change. If, however, the interrogated circuit c4 is to signal a "1" to the data source bq, the interrupter transistor tt will be turned on in the interval t1–t2. The current i then has the characteristic indicated by the dashed line. The ON time was reduced in the clock period T from the interval t1 to the interval t2. The bus line b thus acts on the respective ON time in a similar manner as a wired OR acts on the respective voltage level. The evaluation of the ratio t1/t2 in the comparator v indicates the received logic state. In this manner, data can be read on a serial-by-bit basis.

In automobiles, for example, such an interrogation enables a central processor to read a multitude of data which relate to measured quantities, manipulated variables, temperatures, etc., and are important for a control program.

FIG. 6 shows schematically an embodiment of a bidirectional data interface in which the inductive high-frequency transmission stage ui of FIG. 4 is replaced with a capacitive high-frequency transmission stage uk. Voltage isolation is provided by a first capacitor k1 and a second capacitor k2, which are integrated on the circuit c4 with suitable safety distances. Rectification of the high-frequency signal ont the secondary side is accomplished by means of a bridge rectifier D', which is more effective than a single diode D. The high-frequency generator g may provide a sine-wave or rectangular output signal for feeding the high-frequency transmission stage ui, uk, as in FIG. 4.

What is claimed is:

1. An interface for controlling a first circuit from a second circuit wherein said second circuit operates from voltages that are not referenced to any voltage in said first circuit, comprising:
   a coupling loop connected to a bus line connected to said second circuit, said bus line having signals propagating as a current therein; and
   a Hall-voltage-measuring device positioned proximate to said coupling loop responsive to the current of said bus line by sensing the magnetic field of the coupling loop caused by said current, said Hall-voltage-measuring device generating an output signal that controls said first circuit, said output signal being referenced to a voltage of said first circuit and not being referenced to any voltage of said second circuit.

2. The interface as defined in claim 1, wherein said Hall-voltage-measuring device is implemented together with said first circuit using monolithic integrated circuit techniques.

3. The interface as defined in claim 1, wherein said signals transmitted on said bus line have a data format comprising an address part and a data part, said data format being generated by a data source which can address additional circuits, each additional circuit having a coupling loop, said coupling loops of said first circuit and said additional circuits being connected in series via said bus line.

4. The interface as defined in claim 1, wherein said data interface is bidirectional and said interface further comprises an interrupter stage to effect transfer of data from said first circuit to said data source, said interrupter stage interrupting said current in said loop in an interrogation interval in a defined manner.

5. The interface as defined in claim 4, wherein:

said interrupter stage comprises an interrupter transistor in a current path that includes said coupling loop; and a control-voltage source is connected between a reference electrode and a control electrode of said interrupter transistor, said control-voltage source generating a control voltage to said control electrode, said control-voltage source controlled by said first circuit when said first circuit is being interrogated by said data source.

6. The interface as defined in claim 5, wherein current flowing in said coupling loop is interrupted in a defined manner by said interrupter transistor and said control-voltage source, said current having a mark/space ratio that changes in said interrogation interval during at least one clock period.

7. The interface as defined in claim 5, wherein said interrupter transistor is an MOS transistor.

8. The interface as defined in claim 7, further comprising an inductive or capacitive high-frequency transmission stage and a rectifier circuit, and wherein said interrupter transistor is an enhancement-type MOS transistor having gate and source terminals that are supplied with an associated output of said inductive or capacitive high-frequency transmission stage via said rectifier circuit.

9. The interface as defined in claim 7, further including a high-frequency generator and a switch device, wherein said inductive or capacitive high-frequency transmission stage has a primary side connected through said switch device to said high-frequency generator.

10. The interface as defined in claim 4, wherein:
said data source comprises a current sensor coupled to a data generator and a comparator; and during said interrogation interval, said comparator compares an actual current level on said bus line with a desired current level to provide a comparison result, and, based on said comparison result, determines data read from a circuit addressed by said data source.

* * * * *